United States Patent [19]

Walker

[11] Patent Number: 4,613,857

[45] Date of Patent: Sep. 23, 1986

[54] REPEATED INFORMATION DETECTION

[75] Inventor: Ian C. Walker, Newbury, England

[73] Assignee: Micro Consultants Limited, Surrey, England

[21] Appl. No.: 568,987

[22] Filed: Jan. 3, 1984

[30] Foreign Application Priority Data

Jan. 4, 1983 [GB] United Kingdom ................. 8300025

[51] Int. Cl.[4] .............................................. G09G 1/00
[52] U.S. Cl. .................................... 340/724; 340/720; 340/801; 382/44
[58] Field of Search ............... 340/700, 720, 723, 724, 340/726, 703, 798, 799, 801; 382/42, 44

[56] References Cited

U.S. PATENT DOCUMENTS

| | | | |
|---|---|---|---|
| 2,962,625 | 11/1960 | Berwin et al. | 340/721 |
| 3,781,785 | 12/1973 | Balch | 340/723 |
| 4,120,049 | 10/1978 | Thaler | 382/44 |
| 4,164,728 | 8/1979 | Marsh | 382/44 |
| 4,352,105 | 9/1982 | Harney | 340/703 |
| 4,425,643 | 1/1984 | Chapman | 340/801 |

Primary Examiner—Marshall M. Curtis
Attorney, Agent, or Firm—Dowell & Dowell

[57] ABSTRACT

A repeated information detection system stores incoming information in a RAM store which may have been converted from analog form via a conditioning amplifier and an analog-to-digital converter. On read out, selected information is assigned brightness levels by means of a look-up table, before conversion into analog form in an digital-to-analog converter and then to a display via an amplifier in which synchronizing signals are added. The information read out is varied by controlling the read addressing, the operator being able to select the number of selected points per line and the offset for example, to allow repeated data patterns to be manipulated and detected using visual correlation.

12 Claims, 3 Drawing Figures

REPEATED INFORMATION DETECTION

BACKGROUND TO THE INVENTION

The invention relates to a system for repeated information detection especially from low amplitude signals.

In signal processing systems (e.g. seismographic signals) there is a requirement to monitor information from a probe to determine whether any features of interest are present, typically using autocorrelation and cross-correlation techniques. With computer analysis, for example, it can be difficult to distinguish such information, especially when the signals are of low amplitude and appear to be generally similar to adjacent information.

The present arrangement is concerned with improving the detection of such signals.

SUMMARY OF THE INVENTION

According to the invention there is provided a repeated information detecting system comprising display means for displaying an applied signal in a sequence of lines to form a two dimensional display in which signal elements of different values are represented by different brightnesses of respective line elements, each line being scanned in a line period, means for storing an incoming signal, so that different signal elements are stored in different locations, and means for selecting sequences of signal elements from said store for application to said display means during successive line periods so that the selected signal elements applied during different line periods are displayed in proximity to each other, said selecting means including means for variably offsetting the locations in the store from which the selection of signal elements is made during a line period to allow an operator of the repeated information detection system to search for brightness correlation between different displayed lines.

Such a system in effect relies on the human eye to perform autocorrelation and cross-correlation, by presenting the information in an appropriate manner for the eye to assess.

The incoming signal may be in the form of a plurality of streams and storage means may be provided to allow offset data from more than one stream to be presented.

BRIEF DESCRIPTION OF DRAWINGS

The invention will now be described with reference to the accompanying drawings in which.

DESCRIPTIONS OF PREFERRED EMBODIMENTS

Figure 1:
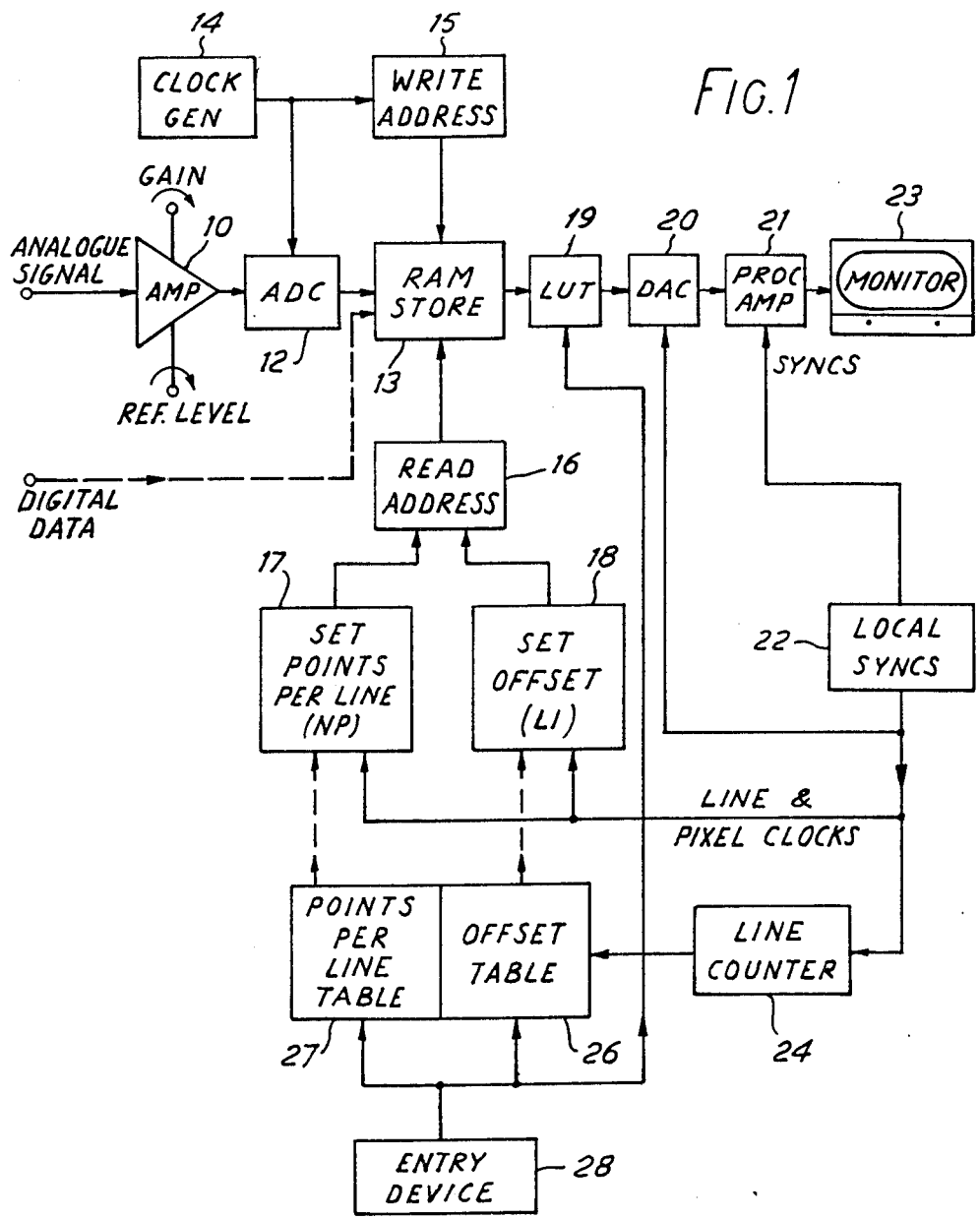
FIG. 1 shows an embodiment of the system of the present invention.

The embodiment of the invention shown in FIG. 1 is concerned with taking an incoming signal and assigning brightness levels to different data elements in the signal and then selectively reading out a sequence of the data elements in a format suitable for display on a T.V. monitor or other raster display 23 to allow the human eye to detect the repeated occurrence of similar brightness patterns. This display means constitutes means for displaying an applied signal in a sequence of lines to form a two dimensional display in which signal elements of different values are represented by different brightnesses of respective line elements.

An analog signal is received by signal conditioning amplifier 10 which enables the amplification of the incoming signal to be adjusted, and also enables a suitable d.c. reference level to be set. The output from amplifier 10 is passed to ADC 12 which digitises the signal and the digitised signal is passed to a RAM store 13 under the control of clock generator 14 and write address block 15.

Alternatively, as shown, the incoming data may already be in digital form (serial or parallel) and can be passed directly to the RAM store 13. As well understood, the RAM store 13 operates to store the different digitised elements of the incoming signals in different locations.

On read out from the store 13, selected digital signal elements are assigned desired brightness levels by means of a look-up-table 19 and the resultant signal elements are converted into analog form in DAC 20 and then passed to an amplifier 21 where synchronising information is added to allow the signal elements to be displayed on the monitor 23. The signal elements modulate the brightness of the display, and those which are applied during successive line periods will be displayed in proximity to each other.

Peripherals such as a VTR or a hard copy device may also be provided. The synchronising information may be provided by a local sync generator 22 which also produces line and pixel clocks for use by the read addressing block 16. The block 16 is arranged to select the sequence of signal elements from the store 13 which during each line period is applied to the monitor 23, after translation by means of the look-up table 19.

This address selection can be manipulated by "points-per-line" selector 17 and offset selector 18. The selector 17 is set to determine how many elements of an original signal stream are selected for read out to form one line of the display. It achieves this by defining the number of locations in store 13 from which signal elements are read for display, in the line period. The offset between the sequence of displayed elements derived from the storage locations as between one line and the next is set by means of the selector 18.

The selectors 17 and 18 are under the control of associated look-up-tables 27 and 26 respectively. An entry device 28 (e.g. a keyboard or thumbwheel switches) is used to set the values in the tables 26, 27 and also the brightness values in look-up-table 19. A line counter 24 is included so that it is possible to vary the number of elements displayed line by line, and also the offset from a reference point in a given data stream or streams represented by the incoming signal or signals. The accessing of the store read address may be in forward or reverse order and may also be variable on a line by line basis if desired. The operation will now be illustrated by reference to FIG. 2 which illustrates one of the many possible modes of operation.

A representative analog signal stream as received is shown and the waveform resulting from the processing in the apparatus of FIG. 1 and available for display, is also shown. The ordinate in the second waveform represents the brightness displayed. By reason of the choice of translations between input signal levels and displayed brightness levels some of the background noise from the signal has been eliminated. The human eye itself also assists in this discrimination.

For simplicity, the brightness levels are shown as having a linear relationship, above a certain threshold, to the incoming signal. However step functions or other relationships may be provided by suitably setting up look-up-table 19.

Figure 2:
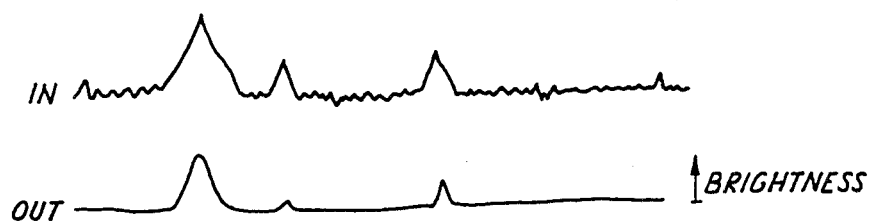
FIG. 2 shows brightness levels and offsets assigned to received data.
Figure 2:
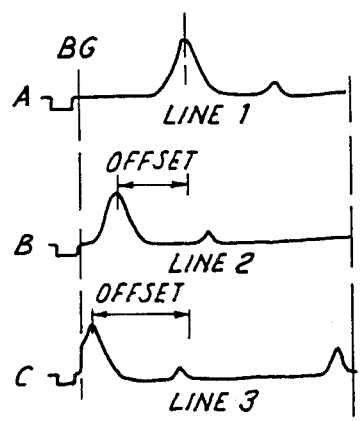

The values for offset and points per line (e.g. zero and 500 say) are chosen so that the portion of the stream displayed as line 1 is as shown in FIG. 2. Different offset for subsequent lines (see B and C) causes a different portion of the data to be displayed. By decreasing the number of points per line a magnification effect can be achieved on a given line displayed.

Figure 3:
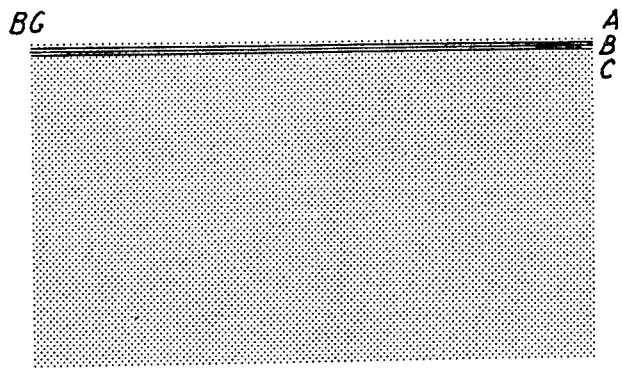
FIG. 3 shows the raster displayed data derived therefrom.

The control values can be updated automatically line by line in response to the output of the line counter 24. Synchronising information provided at amplifier 21 is present at the start of each line as shown. The build-up of the picture on the T.V. screen is represented in FIG. 3. This picture is built up of sequences of horizontal lines in known manner.

Successive lines of data as displayed comprise overlapping portions of the same input signal sequence, but this need not necessarily be the case. The operator can operate the entry device 28 to choose what selection he requires. The offset can be changed line by line if desired. Furthermore, although FIG. 2 represents a situation in which the data displayed on successive lines is selected from a single signal stream, the displayed lines may include data taken from a number of streams not necessarily comprising sequential signals. In such a situation the data may or may not overlap and any offset may vary line by line. Thus there is not necessarily any common part of the data displayed on two or more lines.

By employing the invention it has been found that any repeated pattern of data buried in noise or otherwise difficult to detect may be detected by using the human eye as an area correlation device, the sensitivity of the eye being significantly higher than standard computation methods. The computer can, however, be employed for generation of desired values for the look-up-tables 19, 26 and 27 if desired.

Colour values (either RGB or colour difference components) can be assigned to the data to allow additional visual interpretation if desired.

Where a relationship becomes visually apparent, the identity of the original data can be determined from the knowledge of the addresses at which different signal elements were stored.

I claim:

1. A repeated information detection system comprising:
   display means for displaying an applied signal in a sequence of lines to form a two dimensional display in which signal elements of different values are represented by different brightnesses of respective line elements, each line being scanned in a line period,
   means for storing an incoming signal, so that different signal elements are stored in different locations; and
   means for selecting sequences of signal elements from said store for application to said display means during successive line periods so that the selected signal elements applied during different line periods are displayed in proximity to each other,
   said selecting means including means for variably offsetting the locations in the store from which the selection of signal elements is made during a line period to allow an operator of the repeated information detection system to search for brightness correlation between different displayed lines.

2. A system according to claim 1, in which said storage means is arranged to store signal elements in digital form, and means are provided to translate said digital signal elements into analogue form prior to application to said display means.

3. A system according to claim 2, in which said translating means is arranged to de-emphasise low-value signal elements.

4. A system according to claim 3, in which said translating means includes a manually settable look-up-table for brightness values.

5. A system according to claim 1, in which said offsetting means includes means determining the location in the store for the start of each sequence of selecting signal elements.

6. A system according to claim 5, in which said location determining means is manually settable.

7. A system according to claim 5, including line counting means for varying the offset from line to line.

8. A system according to claim 1, in which said selecting means includes means for selecting signal elements from the same incoming signal or from different incoming signals during successive line periods, to search for auto-correlations or cross correlations.

9. A system according to claim 1, in which said selecting means includes means for varying the number of signal elements selected in each sequence.

10. A system according to claim 9, in which said means for varying the number of signal elements is manually settable.

11. A system according to claim 7, including means for inserting line synchronising signals into the signals applied to the display means, said line counting means being responsive to said line synchronising signals.

12. A system according to claim 1, including a source of incoming signals from a probe device.

* * * * *